United States Patent [19]

Imrie

[11] 4,204,152
[45] May 20, 1980

[54] HIGH AND LOW VOLTAGE MEASURING APPARATUS EMPLOYING A SINGLE DISPLAY AND IMPEDANCE MATCHING

[76] Inventor: James A. Imrie, 18 Amberley Crescent, Frankston, Victoria 3199, Australia

[21] Appl. No.: 922,195

[22] Filed: Jul. 5, 1978

[51] Int. Cl.² .................... G01R 19/00; G01R 15/08; G01R 15/04
[52] U.S. Cl. .................................. 324/390; 324/115; 324/126; 324/128
[58] Field of Search ............... 324/126, 115, 72.5, 324/149, 103 P, 15, 16 R, 128

[56] References Cited
U.S. PATENT DOCUMENTS

| | | | |
|---|---|---|---|
| 1,611,716 | 12/1926 | Brown | 324/103 P |
| 2,613,345 | 10/1952 | Osterland | 324/126 |
| 3,009,099 | 11/1961 | Muller | 324/149 |
| 3,906,344 | 9/1975 | Addis et al. | 324/115 |
| 4,121,154 | 10/1978 | Keating | 324/126 |

Primary Examiner—Rudolph V. Rolinec
Assistant Examiner—Ernest F. Karlsen
Attorney, Agent, or Firm—Cushman, Darby & Cushman

[57] ABSTRACT

Apparatus for measuring a high voltage in an ignition circuit, in which voltage dividing means has a first arm for connection to a point of measurement in said circuit and a second arm connected to a rectifying means. The output of the rectifying means is connected to means for matching impedance at the rectifying means to a direct current voltage display means connected to the output of the impedance matching means such that a displayed voltage is related to the high voltage in the ignition circuit. Low voltage measuring circuitry is also present which is connectable directly to the display means without the use of an impedance matching circuit.

11 Claims, 4 Drawing Figures

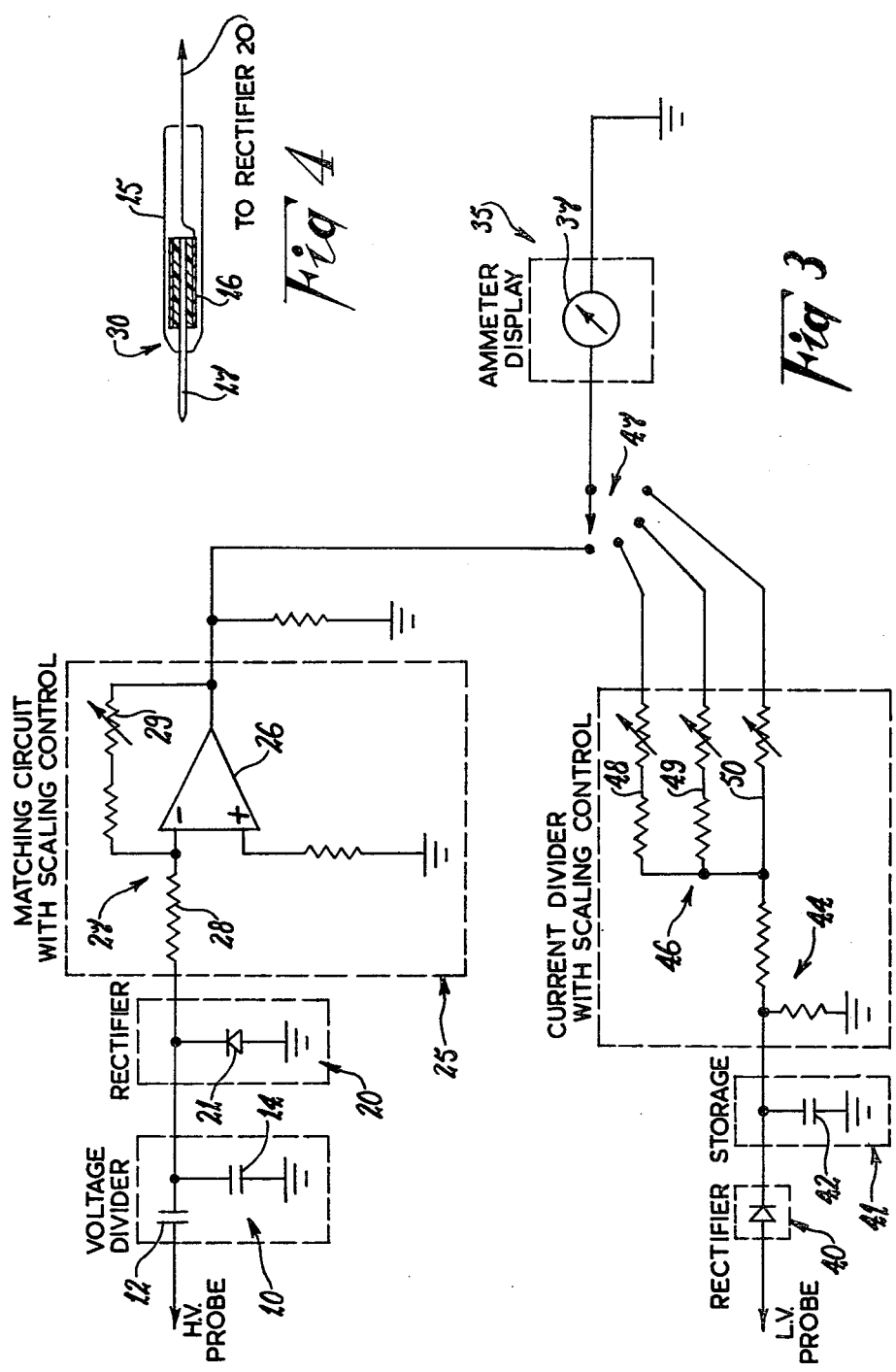

HIGH AND LOW VOLTAGE MEASURING APPARATUS EMPLOYING A SINGLE DISPLAY AND IMPEDANCE MATCHING

The present invention relates to circuit testing apparatus and in particular to apparatus used for testing ignition circuits of the kind employed in internal combustion engines.

The ignition testing apparatus of the present invention has particular application in the measurement and evaluation of high voltages associated with ignition circuits. Ignition testing apparatus as known prior to this invention are generally complex in nature and expensive in construction. It is not usual for such apparatus to be portable thereby fixing them in a workshop location, and they require trained personnel to operate.

It is a primary object of the present invention to provide circuit testing apparatus which is suitable for high voltage measurement, and which is relatively simple and inexpensive in construction. A further object of the present invention is to provide a compact measuring device which is portable. A still further object of the present invention in a preferred form, is to provide a device which may be applied to conventional kettering ignition systems, power pack systems etc., as well as electronic ignition systems which include a plurality of individually triggered ignition circuits. Yet another object of the present invention is to provide apparatus as aforesaid which may be used by relatively unskilled personnel.

With regard to the last point, the portable nature of the device makes it especially suitable for marine use, and other applications where circuit failure or malfunction remote from a workshop can be inconvenient. In the event of engine ignition problems, for example, at a remote location, the device permits "on the spot" diagnosis, and that may reveal that repairs can be carried out at that location.

It will be convenient to hereinafter describe the invention with particular reference to ignition testing, but that is not to be understood as being the only application of the invention.

Prior ignition testing apparatus generally involve the use of cathode ray tube displays, whereas the testing device according to the present invention employs, in a preferred form, a meter movement to display the peak voltages associated with the ignition circuit.

According to the present invention there is provided apparatus for measuring a high voltage in an ignition circuit, said apparatus comprising voltage dividing means having a first arm for connection to a point of measurement in said circuit and a second arm connected to a rectifying means, the output of said rectifying means being connected to means for matching impedance at said rectifying means to a direct current voltage display means connected to the output of said impedance matching means such that a displayed voltage is related to the high voltage in said ignition circuit.

Preferably the voltage dividing means is a capacitive voltage divider, said first arm and second arm each comprising a capacitive element, and the first arm having a capacitance approximately 1000 times greater than the capacitance in the second arm.

Preferably the capacitive element in the first arm comprises a fibreglass board having a conductor placed on each side thereof and is positioned within a high voltage probe unit.

The rectifying means preferably comprises a fast switching diode connected across said second arm such that unwanted portions of the high voltage in the ignition circuit bypass the impedance matching means and the impedance matching means preferably comprises an operational amplifier having inverting and non-inverting inputs connected across the output of the rectifying means and an output connected to said direct current voltage display means. The operational amplifier preferably includes variable gain means comprising an input resistance connected between the output of the rectifying means and each said input of said operational amplifier and an adjustable feedback resistance connected between the output of the operational amplifier and said inverting input of the operational amplifier. Input and feedback resistance are preferably chosen such that the gain of said operational amplifier is adjustable in the range 0.01 to 0.05.

An apparatus as described above can be powered from an A.C. or D.C. source, whichever is preferred for the particular application. The apparatus can be used with any ignition system, such as a conventional kettering system, or power pack system or a system having a plurality of SCR circuits. Peak circuit voltage as detected by the apparatus can be related to engine malfunction or inferior performance, in a manner well known to persons skilled in engine analysis. That peak voltage is displayed by needle deflection, in the apparatus of the invention.

If desired, the apparatus may incorporate means whereby the meter needle can be held at the maximum voltage position for a suitable period of time, and in that event a reset facility will be included also. Such hold means is not essential however, since the preferred capacitive voltage divider holds needle movement to a speed acceptable for visual detection of the peak voltage position.

According to a further aspect of the present invention which may be used in association with or separate from the arrangement so far described, the apparatus may be adapted to measuring comparatively low or primary voltages such as those associated with ignition circuits. It should be appreciated that the primary voltage may be several hundred volts when using power pack or other electronic ignition systems. In adapting the ignition testing apparatus to low voltage applications the apparatus includes a low voltage measuring means comprising a further rectifying means for connection to a point of measurement in said circuit, a voltage storage means and a further voltage dividing means, the output of said further rectifying means being connected via said storage means to said further voltage dividing means and the output of said further dividing means being connected to said direct current voltage display means such that a displayed voltage is related to the low voltage in said ignition circuit.

Preferably in the above apparatus a further rectifying means comprises a fast switching diode connected such that unwanted portions of the low voltage in the ignition circuit do not pass to the storage means. The storage means attached to the output of the further rectifying means in a preferred form of the invention comprises a capacitive element.

According to a preferred form of the present invention the high voltage testing circuit may be combined with the low voltage testing circuit into a single testing apparatus. To improve compactness, a single voltage display means is used for both testing circuits and includes a switch over means adapted to select the required testing circuit. The preferred direct current voltage display means in the above forms of the invention comprises an ammeter having a shunt resistance thereacross.

A preferred embodiment of the present invention will now be described with reference to the accompanying drawings wherein:

FIG. 3 shows in combined form, the schematic circuit for the high and low voltage circuits of the testing apparatus according to the preferred embodiment of the present invention; and FIG. 4 is a schematic drawings of one form of probe suitable for use in testing apparatus of the invention.

Figure 1:
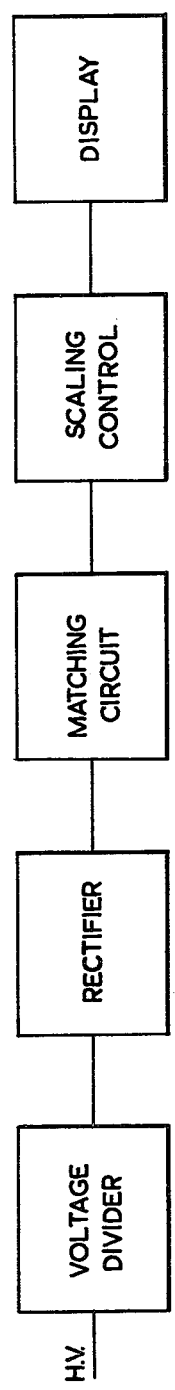
FIG. 1 shows in block diagram form the high voltage testing apparatus according to a preferred embodiment of the present invention.

With reference to FIG. 1 the high voltage signal to be measured is suitably connected to a voltage divider which substantially reduces the voltage output signal. The voltage output signal from the divider is modified by means of a rectifier and that modified signal applied to a measuring display by an impedance matching circuit with appropriate scaling control.

Figure 2:
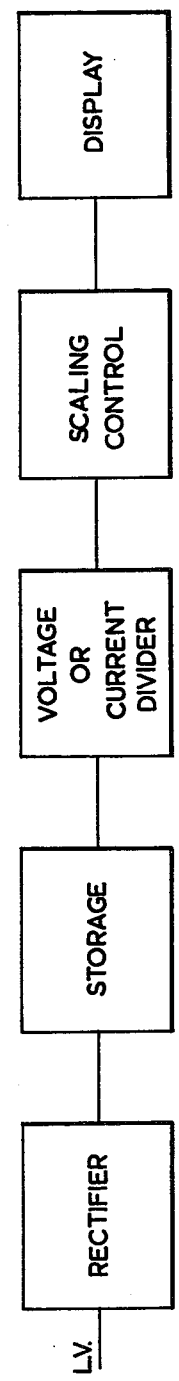
FIG. 2 shows in block diagram form the low voltage testing apparatus according to the preferred embodiment of the present invention.

A low voltage signal to be measured as shown in FIG. 2 is modified by a rectifier and that modified signal coupled to a suitable voltage storage. The output from the voltage storage is applied to a suitable display by a suitable voltage or current divider with appropriate scaling control.

A schematic circuit diagram for a preferred circuit of testing apparatus in accordance with the invention is shown in FIG. 3. The circuit comprises a voltage divider 10 which includes an input capacitor 12 and an output capacitor 14. Preferably, input capacitor 12 is well insulated to retain the greater share of the high input voltage being measured. A voltage dividing ratio of $10^{-3}$ is typical for the high voltage divider.

FIG. 4 shows one form of probe which incorporates the input capacitor 12. In this form, the probe comprises a housing 15 with the capacitor 10 mounted therein. The capacitor 10 preferably comprises a cylindrical body 16 which defines one of the electrodes and an inner electrode 17; the electrodes being separated by a suitable dialectric material. Inner electrode 17 forms a sensing terminal for connection to a desired section of the circuit being tested and electrode 16 is connected to the output capacitor 14 and rectifier 20. In an alternative arrangement the input capacitor may comprise a fiber-glass board with conductors or electrodes placed on either side.

The rectifier 20 comprises a diode 21 and a fast switching diode to cater for short time duration transients which can occur in ignition circuits.

Matching circuit 25 comprises an amplifier 26 having inverting and non-inverting inputs connected across the output of the rectifier 20, the output of the matching circuit being connected to display means 35. Scale adjustment is effected by variable gain means 27 which comprises an input resistance 28 connected between the rectifier 20 and the inverting input of amplifier 26 and an adjustable feed back resistance 29 connected between the inverting input and output of the amplifier 26.

Display means 36 is preferably in the form of an ammeter 37 and is connected to the output of amplifier 26 so that a measurement can be made of a voltage indicative of the high voltage produced in the ignition circuit.

The low voltage testing circuit which is in the form shown in the lower portion FIG. 3 can be used in conjunction with the high voltage testing circuit shown in the upper portion of this figure and comprises a rectifier 40 which is connected to the point of measurement in a circuit. The connection can take any suitable form such as a sensing probe or the like. The output of rectifier 40 is connected to voltage storage means 41 which comprises capacitor 42. A voltage divider 44 is connected to the output from voltage storage 41 and is connected to display means 35 through adjustable scale control 46 and switch 47.

The low voltage testing circuit shown in FIG. 3 includes three current dividing networks 48, 49, 50, any one of which may be selected to obtain the desired sensitivity. The current dividing networks are used in conjunction with an ammeter display 35.

Voltage dividing networks may also be used in conjunction with a voltmeter display to perform an equivalent function of adjusting the sensitivity. Variable scaling resistors are also included in each of the current dividing networks.

Before applying the high voltage testing apparatus to an ignition circuit the apparatus must first be calibrated. Calibration is carried out by adjusting the scaling resistor so that the output display reading corresponds to the voltage peaks encountered in the ignition circuit. This may be performed in conjunction with conventional cathode ray tube display ignition testing apparatus.

Once the apparatus is calibrated for a given ignition circuit, the setting obtained may be used whenever the testing apparatus is applied to other ignition circuits, although it is preferred that such other circuits exhibit a substantially similar ignition waveform. Should the testing apparatus be applied to an ignition circuit not exhibiting a substantially similar waveform, the accuracy of the testing apparatus may be improved by recalibrating the testing apparatus for the new ignition circuit. Preferably the scaling control resistor is marked for each calibration setting to enable the setting to be returned to any previously calibrated setting.

Calibration of the low voltage testing apparatus is carried out by adjusting the scaling resistors in an analogous manner to that described above in relation to the high voltage testing apparatus. Adjustment of the sensitivity of the low voltage testing apparatus is achieved by selecting the appropriate current dividing network and is dependent upon the type of ignition circuit being testing. For example, a conventional kettering ignition system will require greater sensitivity than a power pack or other electronic ignition system.

Although the above embodiment has been described in relation to negative earth type ignition systems it will be apparent to those skilled in the art that the present invention is equally applicable to positive earth type ignition systems and any modification to the invention to achieve such application will be equally apparent.

It is to be understood that various alterations, modifications and/or additions may be introduced into the constructions and arrangements of parts previously described without departing from the spirit or ambit of the present invention.

What I claim is:

1. Diagnostic apparatus for measuring voltages in an ignition circuit of an internal combustion engine, said apparatus comprising, in combination: a high voltage measuring circuit and a low voltage measuring circuit, said high voltage measuring circuit comprising a capacitive voltage divider having a first capacitive means for connection to a point of measurement in said circuit to provide connection between said point and a second capacitive means of said divider, the voltage developed across said second capacitive means constituting the output of said voltage divider and being connected to a rectifying means comprising a first switching diode connected across said second capacitive means, the output of said rectifying means being connected to means for matching impedance at said rectifying means to a direct current voltage display means connectable to the output of said impedance matching means such that a displayed voltage is related to the high voltage in said ignition circuit, said impedance matching means comprising an operational amplifier having its inverting and non-inverting inputs connected to the output of said rectifying means, said first switching diode being connected across said second capacitive means such that unwanted portions of the high voltage in said ignition circuit do not pass to said operational amplifier, said low voltage measuring circuit comprising a voltage storage means, a further rectifying means for connection to a point of measurement in said circuit to provide connection between said point and said voltage storage means, said further rectifying means comprising a second switching diode and said voltage storage means comprising a capacitive storage means, said second switching diode being connected to said capacitive storage means such that unwanted portions of the low voltage in said ignition circuit do not pass to said capacitive storage means, the output of said voltage storage means being connected to the input of a voltage dividing means having its output connectable to said direct current voltage display means, said voltage dividing means comprising resistive elements.

2. Apparatus according to claim 1 wherein said direct current voltage display means is connectable via a switching means to the output of said impedance matching means and to the output of said voltage dividing means.

3. Apparatus according to claim 1 wherein said second capacitive means has a capacitance approximately 1000 times the capacitance of said first capacitive means.

4. Apparatus according to claim 1 wherein said first capacitive means comprises a fiberglass board having a conductor placed on each side thereof.

5. Apparatus according to claim 1 wherein said first capacitive means comprises concentric cylindrical electrodes separated by a suitable dialectric material.

6. Apparatus according to claim 5 wherein said first capacitive means comprises a high voltage probe unit.

7. Apparatus according to claim 1 wherein said operational amplifier includes variable gain means comprising an input resistance connected between the output of said rectifying means and each said input of said operational amplifier and an adjustable feedback resistance is connected between the output of said operational amplifier.

8. Apparatus according to claim 7 wherein the gain of said operational amplifier is adjustable in the range 0.01 to 0.05.

9. Apparatus according to claim 1 wherein the ratio of said voltage dividing means is adjustable.

10. Apparatus according to claim 1 wherein said second switching diode is connected to a low voltage probe unit.

11. Apparatus according to claim 1 wherein said direct current voltage display means comprises an ammeter having a shunt resistance thereacross.

* * * * *